(12) United States Patent
Swei et al.

(10) Patent No.: US 8,183,913 B2
(45) Date of Patent: May 22, 2012

(54) INTEGRATED CIRCUITS INCLUDING A CHARGE PUMP CIRCUIT AND OPERATING METHODS THEREOF

(75) Inventors: Steven Swei, Fremont, CA (US); Chih-Chang Lin, San Jose, CA (US); Tien-Chun Yang, San Jose, CA (US); Chan-Hong Chern, Palo Alto, CA (US); Ming-Chieh Huang, San Jose, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 200 days.

(21) Appl. No.: 12/706,886

(22) Filed: Feb. 17, 2010

(65) Prior Publication Data

US 2011/0199152 A1   Aug. 18, 2011

(51) Int. Cl.
*G05F 1/10* (2006.01)
*G05F 3/02* (2006.01)

(52) U.S. Cl. ......... 327/537; 327/148; 327/157; 327/536

(58) Field of Classification Search .................. 327/141, 327/144–163, 535–537; 331/1 A, 15–17; 375/373–376; 363/59, 60
See application file for complete search history.

(56) References Cited

U.S. PATENT DOCUMENTS

| | | | | |
|---|---|---|---|---|
| 6,124,755 | A * | 9/2000 | Parker et al. | 327/543 |
| 6,853,253 | B2 * | 2/2005 | Desortiaux | 331/16 |
| 7,256,631 | B2 * | 8/2007 | Kim | 327/157 |
| 7,418,071 | B2 * | 8/2008 | Harrison | 375/374 |
| 7,570,105 | B1 * | 8/2009 | Baek et al. | 327/536 |
| 7,812,652 | B2 * | 10/2010 | Mei | 327/156 |
| 2005/0195003 | A1 * | 9/2005 | Soe | 327/157 |
| 2005/0237092 | A1 * | 10/2005 | Kawago et al. | 327/157 |

OTHER PUBLICATIONS

Loke, Alvin L. S., et al., "A Versatile 90-nm CMOS Charge-Pump PLL for SerDes Transmitter Clocking", IEEE Journal of Solid-State Circuits, vol. 41, No. 8, Aug. 2006, pp. 1894-1907.

* cited by examiner

*Primary Examiner* — Lincoln Donovan
*Assistant Examiner* — Brandon S Cole
(74) *Attorney, Agent, or Firm* — Lowe Hauptman Ham & Berner, LLP

(57) ABSTRACT

An integrated circuit includes a first current source. A second current source is electrically coupled with the first current source via a conductive line. A switch circuit is coupled between the first current source and the second current source. A first circuit is coupled between a first node and a second node. The first node is disposed between the first current source and the switch circuit. The second node is coupled with the first current source. The first circuit is configured for substantially equalizing voltages on the first node and the second node. A second circuit is coupled between a third node and a fourth node. The third node is disposed between the second current source and the switch circuit. The fourth node is disposed coupled with the second current source. The second circuit is configured for substantially equalizing voltages on the third node and the fourth node.

17 Claims, 4 Drawing Sheets

INTEGRATED CIRCUITS INCLUDING A CHARGE PUMP CIRCUIT AND OPERATING METHODS THEREOF

FIELD OF THE DISCLOSURE

The present disclosure relates generally to the field of semiconductor circuits, and more particularly, to integrated circuits including a charge pump circuit and operating methods thereof.

BACKGROUND OF THE DISCLOSURE

Phase-locked loops (PLLs) are widely used in electronic designs such as radios, television receivers, video apparatuses, satellite broadcasts, and instrumentation systems. PLLs are electronic circuits with a voltage-controlled oscillator (VCO) or a current-controlled oscillator (CCO) that is constantly driven to match the frequency of an input signal.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION OF THE DISCLOSURE

Figure 1:
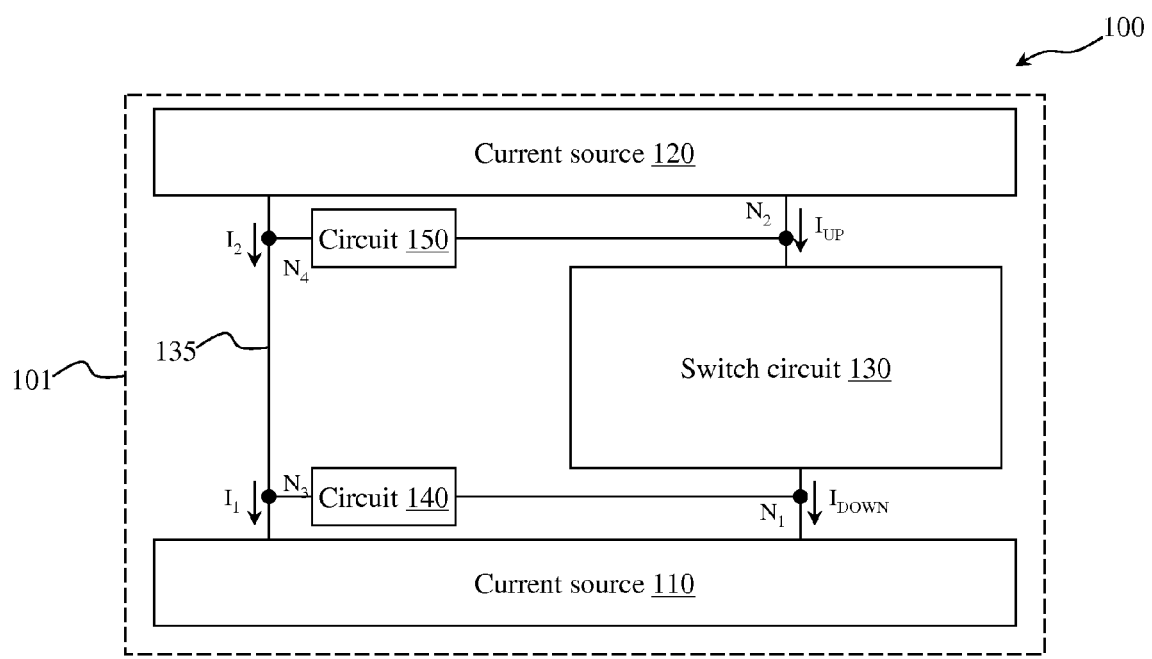
FIG. 1 is a schematic drawing illustrating an exemplary integrated circuit including a charge pump circuit.

A PLL circuit includes a charge pump circuit. The charge pump circuit is disposed between a phase frequency detector (PFD) and a voltage-controlled oscillator (VCO). The charge pump circuit receives signals from the PFD to charge or discharge a capacitor that is disposed on a node between the charge pump circuit and the VCO. A current supplied to charge the capacitor is referred to as an up current. Another current supplied to discharge the capacitor is referred to a down current. By adjusting the up current and the down current, the operation of the PLL circuit can be locked.

The applicants found that the voltage on the output end of the charge pump circuit may shift up and down. The variation of the output voltage may result from channel-length modulation of the transistors. The applicants also found that the process of forming the transistors may cause transistor mismatch. Due to the transistor mismatch and/or the channel-length modulation, when the operation of the PLL circuit is locked, the up current is different from the down current. The difference between the up and down currents can result in reference spur, static phase error, and/or jitter at an output end of the PLL circuit.

Based on the foregoing, integrated circuits including a charge pump circuit and operating methods thereof are desired.

It is understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Embodiments of the present disclosure are directed to integrated circuits including a charge pump circuit and methods of operating the integrated circuit. By substantially equalizing the up current and the down current of the charge pump circuit, reference spur, static phase error, and/or jitter at an output end of the PLL circuit can be desirably reduced. Following are descriptions of exemplary embodiments regarding the integrated circuit and operating methods thereof. The scope of the present application is not limited thereto.

FIG. 1 is a schematic drawing illustrating an exemplary integrated circuit including a charge pump circuit. In FIG. 1, an integrated circuit 100 can include a charge pump circuit 101. The integrated circuit 100 can be an analog phase-locked system, e.g., a phase-locked loop (PLL), a delay-locked loop (DLL), a clock and data recovery (CDR) circuit, or the like. In some embodiments, the charge pump circuit 101 can be disposed between a phase frequency detector (PFD) (not shown) and a voltage-controlled oscillator (VCO) (not shown). At least one capacitor can be coupled with a node that is disposed between the charge pump circuit 101 and the VCO. A current can flow from the charge pump circuit 101 to the capacitor to charge the capacitor or flow to the charge pump circuit 101 from the capacitor to discharge the capacitor.

In some embodiments, the charge pump circuit 101 can include current sources 110 and 120. A switch circuit 130 can be electrically coupled between the current sources 110 and 120. The current sources 110 and 120 can be electrically coupled with each other via a conductive line 135. A circuit 140 can be disposed between nodes $N_1$ and $N_3$. A circuit 150 can be disposed between nodes $N_2$ and $N_4$. The node $N_1$ can be disposed between the current source 110 and the switch circuit 130. The node $N_2$ can be disposed between the current source 120 and the switch circuit 130. The nodes $N_3$ and $N_4$ can be coupled with the current source 110 and 120, respectively. The circuit 140 can be configured for substantially equalizing voltages on the nodes $N_1$ and $N_3$. The circuit 150 can be configured for substantially equalizing voltages on the nodes $N_2$ and $N_4$.

Referring to FIG. 1, if the phase-locked system is locked, currents $I_1$ and $I_2$ can flow on the nodes $N_3$ and $N_4$, respectively. Since the currents $I_1$ and $I_2$ are flowing on the same conductive line 135, the current $I_1$ flowing on the node $N_3$ can be substantially equal to the current $I_2$ flowing on the node $N_4$. By substantially equalizing the voltages on the nodes $N_1$ and $N_3$, the current $I_1$ flowing on the node $N_3$ can be substantially equal to a current $I_{DOWN}$ flowing on the node $N_1$. In some embodiments, the current $I_{DOWN}$ can be referred to as a down current. By substantially equalizing the voltages on the nodes $N_2$ and $N_4$, the current $I_2$ flowing on the node $N_4$ can be substantially equal to a current $I_{UP}$ flowing on the node $N_2$. In some embodiments, the current $I_{up}$ can be referred to as an up current. The current $I_{DOWN}$ can be substantially equal to the current $I_{UP}$. By substantially equalizing the currents $I_{UP}$ and $I_{DOWN}$, reference spur, static phase error, and/or jitter at an output end of the integrated circuit 100 can be desirably reduced.

Figure 2:
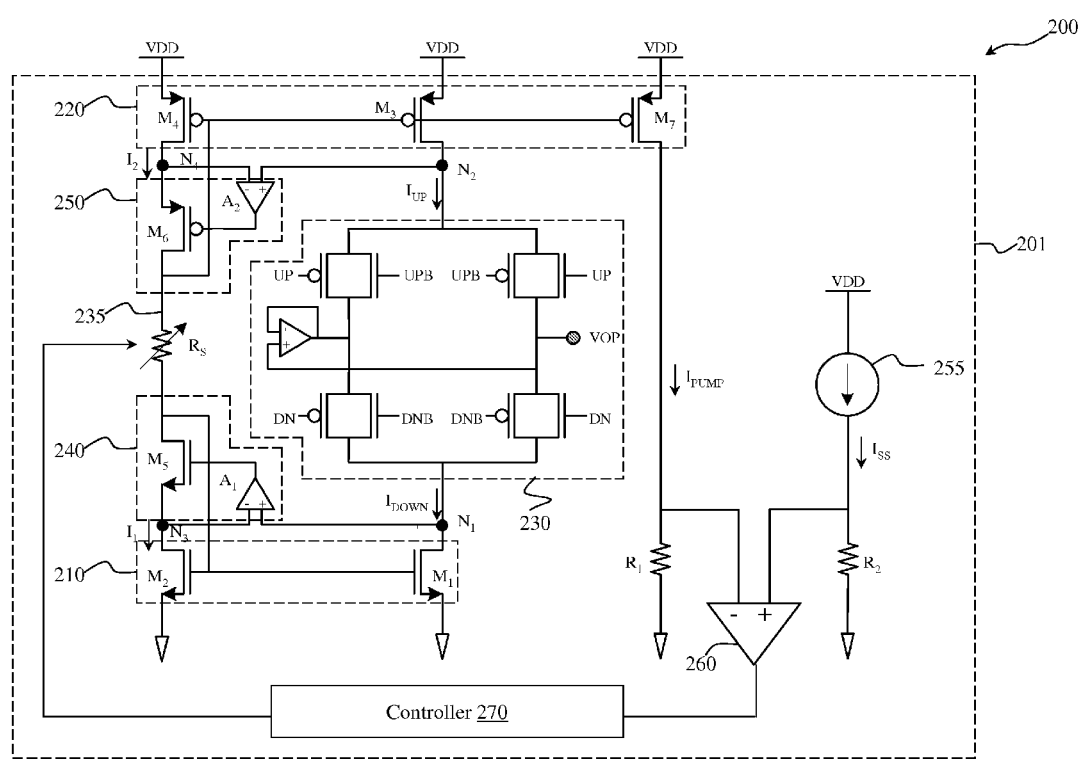
FIG. 2 is a schematic drawing illustrating another exemplary integrated circuit including an exemplary charge pump circuit.

FIG. 2 is a schematic drawing illustrating another exemplary integrated circuit including an exemplary charge pump circuit. Items of FIG. 2 that are the same items in FIG. 1 are indicated by the same reference numerals, increased by 100. In FIG. 2, a current source 210 can include transistors $M_1$ and $M_2$. In some embodiments, the transistors $M_1$ and $M_2$ can be NMOS transistors. Gates of the transistors $M_1$ and $M_2$ can be coupled with each other. Drains of the transistors $M_1$ and $M_2$ can be coupled with the nodes $N_1$ and $N_3$, respectively. Sources of the transistors $M_1$ and $M_2$ can be coupled to a power source, e.g., power source $V_{SS}$ or ground.

Referring again to FIG. 2, a current source 220 can include transistors $M_3$ and $M_4$. In some embodiments, the transistors $M_3$ and $M_4$ can be PMOS transistors. Gates of the transistors $M_3$ and $M_4$ can be coupled with each other. Drains of the transistors $M_3$ and $M_4$ can be coupled with the nodes $N_2$ and $N_4$, respectively. Sources of the transistors $M_3$ and $M_4$ can be coupled to a power source, e.g., power source $V_{DD}$. It is noted that the disposition, number, and/or type of transistors in the current sources 210 and 220 are merely exemplary. One skilled in the art can modify them to achieve desired current sources.

Referring again to FIG. 2, a switch circuit 230 can include pass gates (not labeled). In some embodiments, two pass gates can be coupled in series. The series pass gates can be coupled with another series pass gates in parallel. Each of the pass gates can receive at least one control signal, e.g., signals UP/UPB or DN/DNB, to turn on or off transistors of the pass gates so as to charge or discharge a capacitor (not shown) coupled with an output end VOP of the switch circuit 230. The switch circuit 230 can include an amplifier (not labeled). The amplifier can be disposed between the two series pass gates. It is noted that the disposition, number, and/or type of transistors of the switch circuit 230 are merely exemplary. One skilled in the art can modify them to achieve a desired switch circuit.

Referring to FIG. 2, a circuit 240 can be disposed between the nodes $N_1$ and $N_3$. In some embodiments, the circuit 240 can include an amplifier $A_1$ and a transistor $M_5$, such as an NMOS transistor. The amplifier $A_1$ can have a gain of about 60 dB or more. Input ends of the amplifier $A_1$ can be coupled between the nodes $N_1$ and $N_3$. An output end of the amplifier $A_1$ can be coupled with a gate of the transistor $M_5$. A source of the transistor $M_5$ can be coupled with the node $N_3$.

As noted, the circuit 240 is configured for substantially equalizing the voltages on the nodes $N_1$ and $N_3$. For example, the amplifier $A_1$ can detect the voltages on the nodes $N_1$ and $N_3$. If the voltage on the node $N_1$ is higher than that of the node $N_3$, the amplifier $A_1$ can output a signal to the transistor $M_5$. The signal can control the transistor $M_5$ for pulling up the voltage on the node $N_3$ such that the voltage on the node $N_1$ is substantially equal to the voltage on the node $N_3$. If the voltage on the node $N_1$ is lower than that of the node $N_3$, the amplifier $A_1$ can output a signal to the transistor $M_5$. The signal can control the transistor $M_5$ for pulling down the voltage on the node $N_3$ such that the voltage on the node $N_1$ is substantially equal to the voltage on the node $N_3$.

As noted, the currents $I_{DOWN}$ and $I_1$ flowing on the nodes $N_1$ and $N_3$, respectively, are substantially equal to currents flowing through the transistors $M_1$ and $M_2$, respectively. The currents $I_{DOWN}$ and $I_1$ are related to the voltage drops $V_{Ds}$ of the transistors $M_1$ and $M_2$, respectively. As noted, the sources of the transistors $M_1$ and $M_2$ are coupled to the same voltage source, e.g., $V_{SS}$ or ground. Since the circuit 240 substantially equalizes the voltages on the nodes $N_1$ and $N_3$, i.e., the drains of the transistors $M_1$ and $M_2$, respectively. The voltage drop $V_{ds}$ of the transistors $M_1$ can be substantially equal to that of the transistor $M_2$. The current $I_{DOWN}$ can be substantially equal to the current $I_1$.

Referring to FIG. 2, the circuit 250 can be disposed between the nodes $N_2$ and $N_4$. In some embodiments, the circuit 250 can include an amplifier $A_2$ and a transistor $M_6$, e.g., a PMOS transistor. The amplifier $A_2$ can have a gain of about 60 dB or more. Input ends of the amplifier $A_2$ can be coupled between the nodes $N_2$ and $N_4$. An output end of the amplifier $A_2$ can be coupled with a gate of the transistor $M_6$. A source of the transistor $M_6$ can be coupled with the node $N_4$.

As noted, the circuit 250 is configured for substantially equalizing the voltages on the nodes $N_2$ and $N_4$. For example, the amplifier $A_2$ can detect the voltages on the nodes $N_2$ and $N_4$. If the voltage on the node $N_2$ is higher than that of the node $N_4$, the amplifier $A_2$ can output a signal to the transistor $M_6$. The signal can control the transistor $M_6$ to pull up the voltage on the node $N_4$ such that the voltage on the node $N_2$ is substantially equal to the voltage on the node $N_4$. If the voltage on the node $N_2$ is lower than that of the node $N_4$, the amplifier $A_2$ can output a signal to the transistor $M_6$. The signal can control the transistor $M_6$ to pull down the voltage on the node $N_4$ such that the voltage on the node $N_2$ is substantially equal to the voltage on the node $N_4$.

As noted, the currents $I_{UP}$ and $I_2$ flowing on the nodes $N_2$ and $N_4$, respectively, are substantially equal to currents flowing through the transistors $M_3$ and $M_4$, respectively. The currents $I_{UP}$ and $I_2$ are related to the voltage drops $V_{ds}$ of the transistors $M_3$ and $M_4$, respectively. As noted, the sources of the transistors $M_3$ and $M_4$ are coupled to the same voltage source, e.g., $V_{DD}$. Since the circuit 240 substantially equalizes the voltages on the nodes $N_2$ and $N_4$, i.e., the drains of the transistors $M_3$ and $M_4$, respectively. The voltage drop $V_{DS}$ of the transistors $M_3$ can be substantially equal to that of the transistor $M_4$. The current $I_{UP}$ can be substantially equal to the current $I_2$. Since the current $I_1$ is substantially equal to the current $I_2$, the current $I_{UP}$ can be substantially equal to the current $I_{DOWN}$, too. In some embodiments, even if the voltage on the output end VOP of the charge pump circuit 201 may shift up or down, the current $I_{UP}$ can be substantially equal to the current $I_{DOWN}$. By substantially equalizing the currents $I_{UP}$ and $I_{DOWN}$, the reference spur, the static phase error, and/or jitter can be desirably reduced when the phase-locked system is locked. It is noted that the disposition, number, and/or type of the amplifiers and transistors of the circuits 240 and 250 are merely exemplary. One skilled in the art can modify them to achieve desired circuits.

As noted, the current $I_{UP}$ can be substantially equal to the current $I_{DOWN}$. It is found that the currents $I_{UP}$ and $I_{DOWN}$ may be different from a predetermined current that is predetermined to charge or discharge the capacitor (not shown) coupled with the output end VOP of the charge pump circuit

201. The mismatch of the predetermined current and the currents $I_{UP}$ and $I_{DOWN}$ may resulting from the dimensions, e.g., length, of the transistors of the charge pump circuit 200. For example, the predetermined current is about 100 μA and the currents $I_{UP}$ and $I_{DOWN}$ can be about 80 μA. In some embodiments, adjusting the currents $I_{UP}$ and $I_{DOWN}$ to be substantially equal to the predetermined current is desired.

Referring again to FIG. 2, the charge pump circuit 201 can include a current source 255. The current source 255 can be coupled between a power source, e.g., the power source $V_{DD}$, and a resistor $R_2$, which is coupled with another power source, e.g., the power source $V_{SS}$. The current source 255 can be coupled with an input end of the comparator 260.

In some embodiments, the current source 220 can include a transistor $M_7$. The transistor $M_7$ can be, for example, a PMOS transistor. A source of the transistor $M_7$ can be coupled with a voltage source, e.g., the voltage source $V_{DD}$. A drain of the transistor $M_7$ can be coupled with a resistor $R_1$, which is coupled with another power source, e.g., the power source $V_{SS}$. A gate of the transistor $M_7$ can be coupled with the gates of the transistors $M_2$ and $M_4$. By applying the same voltage to gates of the transistors $M_2$, $M_4$, and $M_7$, the current $I_2$ flowing through the transistor $M_4$ can be mirrored to the transistors $M_4$ and $M_7$ such that the current $I_{UP}$ is substantially equal to a charge pump current $I_{pump}$ flows through the transistor $M_7$.

Referring to FIG. 2, the transistor $M_7$ and the current source 255 can be coupled with the input ends of the comparator 260. The charge pump circuit 201 can include a controller 270 coupled with an output end of the comparator 260. The controller 270 can be coupled with an adjustable resistance circuit $R_S$ disposed on a conductive line 235. In some embodiments, the adjustable resistance circuit $R_S$ can be disposed between the circuits 240 and 250. By adjusting the resistance of the adjustable resistance circuit $R_S$, the charge pump current $I_{pump}$ can be adjusted to be substantially equal to a predetermined current $I_{SS}$ that is provided from the current source 255.

As noted, the current source 255 is configured to provide the predetermined current $I_{SS}$. The comparator 260 can receive and compare the predetermined current $I_{SS}$ and the charge pump current $I_{pump}$ so as to output an output signal to a controller 270. Corresponding to the output signal from the comparator 260, the controller 270 is configured to adjust the resistance of the adjustable resistance circuit $R_S$.

For example, if the predetermined current $I_{SS}$ is larger than the charge pump current $I_{pump}$, the controller 270 can adjust the resistance of the adjustable resistance circuit $R_S$ to a lower resistance so as to increase the current $I_2$ flowing through the transistor $M_4$. Since the current $I_2$ is increased, the charge pump current $I_{pump}$ can be increased to a level that is substantially equal to the predetermined current $I_{SS}$.

If the predetermined current $I_{SS}$ is smaller than the charge pump current $I_{pump}$, the controller 270 can adjust the resistance of the adjustable resistance circuit $R_S$ to a higher resistance so as to reduce the current $I_2$ flowing through the transistor $M_4$. Since the current $I_2$ is decreased, the charge pump current $I_{pump}$ can be decreased to a level that is substantially equal to the predetermined current $I_{SS}$. By adjusting the resistance of the adjustable resistance circuit $R_S$, the charge pump current $I_{pump}$ can be substantially equal to the predetermined current $I_{SS}$.

Figure 3:
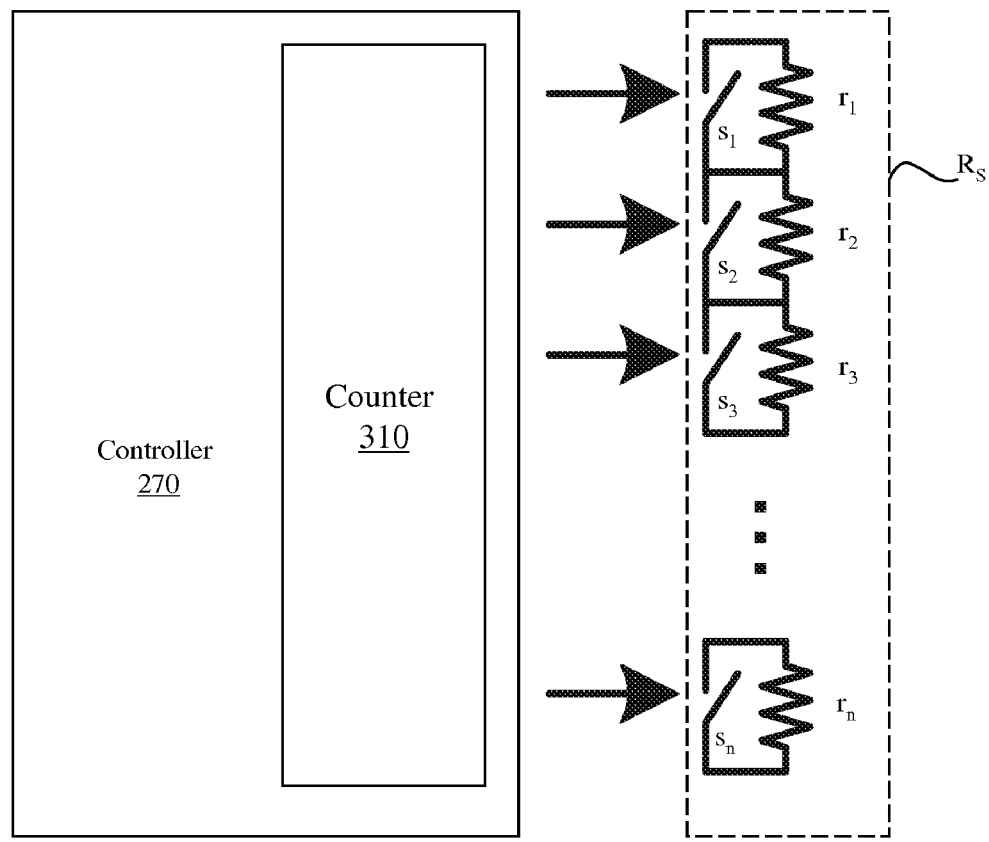
FIG. 3 is a schematic drawing illustrating an exemplary controller coupled with an exemplary adjustable resistance circuit $R_S$.

FIG. 3 is a schematic drawing illustrating an exemplary controller coupled with an exemplary adjustable resistance circuit $R_S$. In FIG. 3, the controller 270 can include a counter 310. The adjustable resistance circuit $R_S$ can include a series of resistors $r_1$-$r_n$ and a series of switches $s_1$-$s_n$. Each of the switches $s_1$-$s_n$ is disposed in parallel with a corresponding one of the resistors $r_1$-$r_n$. The counter 310 is configured to turn on or off at least one of the switches $s_1$-$s_n$ to adjust the resistance of the adjustable resistance circuit $R_S$. It is noted that the adjustable resistance circuit $R_S$ described above in conjunction with FIG. 3 is merely exemplary. One skilled in the art can use any adjustable resistance circuit to adjust the resistance between circuits 240 and 250.

Figure 4:
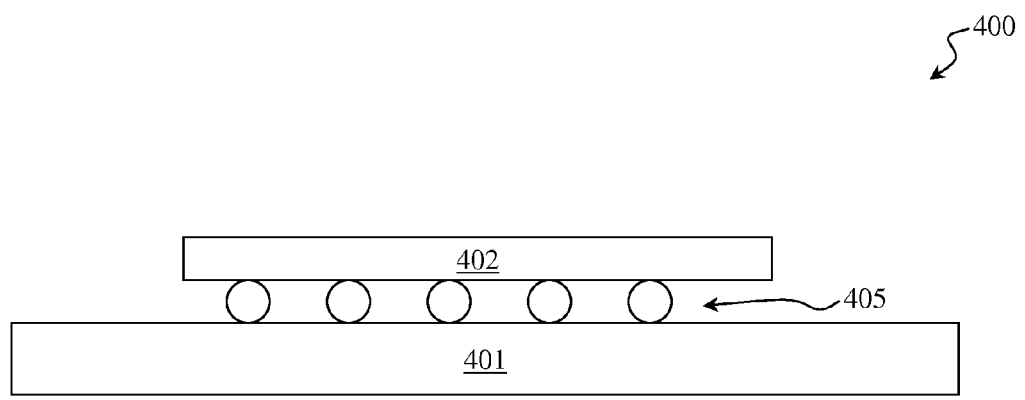
FIG. 4 is a schematic drawing illustrating a system including an exemplary integrated circuit disposed over a substrate board.

FIG. 4 is a schematic drawing illustrating a system including an exemplary integrated circuit disposed over a substrate board. In FIG. 4, a system 400 can include an integrated circuit 402 disposed over a substrate board 401. The substrate board 401 can include a printed circuit board (PCB), a printed wiring board and/or other carrier that is capable of carrying an integrated circuit. The integrated circuit 402 can include a charge pump circuit that is similar to the charge pump circuit 101 or 201 described above in conjunction with FIGS. 1 and 2, respectively. The integrated circuit 402 can be electrically coupled with the substrate board 401. In embodiments, the integrated circuit 402 can be electrically coupled with the substrate board 401 through bumps 405. In other embodiments, the integrated circuit 402 can be electrically coupled with the substrate board 401 through wire bonding. The system 400 can be part of an electronic system such as computers, wireless communication devices, computer-related peripherals, entertainment devices, or the like.

In embodiments, the system 400 including the integrated circuit 402 can provides an entire system in one IC, so-called system on a chip (SOC) or system on integrated circuit (SOIC) devices. These SOC devices may provide, for example, all of the circuitry needed to implement a radio system, a television, a video apparatus, a satellite broadcast system, an instrumentation system, a cell phone, personal data assistant (PDA), digital VCR, digital camcorder, digital camera, MP3 player, or the like in a single integrated circuit.

From the foregoing, in a first embodiment, an integrated circuit includes a first current source. A second current source is electrically coupled with the first current source via a conductive line. A switch circuit is coupled between the first current source and the second current source. A first circuit is coupled between a first node and a second node. The first node is disposed between the first current source and the switch circuit. The second node is coupled with the first current source. The first circuit is configured for substantially equalizing voltages on the first node and the second node. A second circuit is coupled between a third node and a fourth node. The third node is disposed between the second current source and the switch circuit. The fourth node is coupled with the second current source. The second circuit is configured for substantially equalizing voltages on the third node and the fourth node.

In a second embodiment, an integrated circuit includes a first current source and a second current source. A switch circuit is coupled between the first current source and the second current source. A first node is disposed between the first current source and the switch circuit. A second node is disposed between the second current source and the switch circuit. A first transistor is coupled with the first current. A third node is disposed between the first transistor and the first current source. A first amplifier is coupled between the first node and the third node. A second transistor is coupled with the second current source. A fourth node is between the second transistor and the second current source. A second amplifier is coupled between the second node and the fourth node.

In a third embodiment, a method of operating a charge pump circuit of a phase-locked system is provided. The method includes substantially equalizing voltages on a first node and a second node. The first node is disposed between a first current source and a switch circuit of the charge pump circuit. The second node is coupled with the first current source. The method further includes substantially equalizing voltages on a third node and a fourth node. The third node is disposed between the switch circuit and a second current source of the charge pump circuit. The fourth node is coupled with the second current source of the charge pump circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
   a first current source;
   a second current source electrically coupled with the first current source via a conductive line;
   a switch circuit coupled between the first current source and the second current source;
   a first circuit coupled between a first node and a second node, the first node being disposed between the first current source and the switch circuit, the second node being coupled with the first current source, wherein the first circuit is configured for substantially equalizing voltages on the first node and the second node;
   a second circuit coupled between a third node and a fourth node, the third node being disposed between the second current source and the switch circuit, the fourth node being coupled with the second current source, wherein the second circuit is configured for substantially equalizing voltages on the third node and the fourth node;
   a third current source;
   a comparator coupled between the second current source and the third current source;
   a controller coupled with an output end of the comparator; and
   an adjustable resistance circuit coupled with the controller, the adjustable resistance circuit being disposed between the first circuit and the second circuit.

2. The integrated circuit of claim 1, wherein
   the first current source includes a first transistor and a second transistor;
   the second current source includes a third transistor and a fourth transistor;
   the first circuit is disposed between drains of the first and second transistors, wherein the first circuit is configured for substantially equalizing voltages on the drains of the first and second transistors; and
   the second circuit is disposed between drains of the third and fourth transistors, wherein the second circuit is configured for substantially equalizing voltages on the drains of the third and fourth transistors.

3. The integrated circuit of claim 2, wherein the first circuit comprises
   a first amplifier coupled between the drains of the first and second transistors; and
   a fifth transistor having a gate coupled with an output end of the first amplifier.

4. The integrated circuit of claim 3, wherein the second circuit comprises:
   a second amplifier coupled between the drains of the third and fourth transistors; and
   a sixth transistor having a gate coupled with an output end of the second amplifier.

5. The integrated circuit of claim 4, wherein each of the first and second amplifiers has a gain of about 60 dB or more.

6. The integrated circuit of claim 1, wherein the comparator is configured to compare a first current from the second current source and a second current from the third current source to output a signal for triggering the controller to adjust a resistance of the adjustable resistance circuit.

7. The integrated circuit of claim 1, wherein the controller includes a counter, the adjustable resistance circuit includes a series of resistors and a series of switches, and each of the switches is disposed in parallel with a corresponding one of the resistors, wherein the counter is configured to turn on or off at least one of the switches to adjust a resistance of the adjustable resistance circuit.

8. An integrated circuit comprising:
   a first current source;
   a second current source;
   a switch circuit coupled between the first current source and the second current source, wherein a first node is between the first current source and the switch circuit, and a second node is between the second current source and the switch circuit;
   a first transistor coupled with the first current, wherein a third node is disposed between the first transistor and the first current source;
   a first amplifier coupled between the first node and the third node;
   a second transistor coupled with the second current source, wherein a fourth node is disposed between the second transistor and the second current source;
   a second amplifier coupled between the second node and the fourth node
   a third current source;
   a comparator coupled between the second current source and the third current source;
   a controller coupled with an output end of the comparator; and
   an adjustable resistance circuit coupled with the controller, the adjustable resistance circuit being disposed between the first transistor and the second transistor.

9. The integrated circuit of claim 8, wherein each of the first and second amplifiers has a gain of about 60 dB or more.

10. The integrated circuit of claim 8, wherein the comparator is configured to compare a first current from the second current source and a second current from the third current source to output a signal for triggering the controller to adjust a resistance of the adjustable resistance circuit.

11. The integrated circuit of claim 10, wherein the controller includes a counter, the adjustable resistance circuit includes a series of resistors and a series of switches, and each of the switches is disposed in parallel with a corresponding one of the resistors, wherein the counter is configured to turn on or off at least one of the switches to adjust a resistance of the adjustable resistance circuit.

12. A method of operating a charge pump circuit of a phase-locked system, the method comprising:
   substantially equalizing voltages on a first node and a second node, wherein the first node is disposed between a first current source and a switch circuit of the charge pump circuit, and the second node is coupled with the first current source;

substantially equalizing voltages on a third node and a fourth node, wherein the third node is disposed between the switch circuit and a second current source of the charge pump circuit, and the fourth node is coupled with the second current source; and adjusting a resistance of an adjustable resistance circuit disposed between the first node and the third node so as to adjust a charge pump current flowing through the first current source and the second current source.

13. The method of claim 12, wherein substantially equalizing voltages on the first node and the second node comprises:

detecting the voltages on the first node and the second node; and adjusting the voltage on the second node so as to substantially equalize the voltages on the first node and the second node.

14. The method of claim 13, wherein detecting the voltages on the first node and the second node comprises detecting the voltages on drains of a first transistor and a second transistor of the first current source.

15. The method of claim 12, wherein substantially equalizing voltages on the third node and the fourth node comprises:

detecting the voltages on the third node and the fourth node; and adjusting the voltage on the fourth node so as to substantially equalize the voltages on the third node and the fourth node.

16. The method of claim 15, wherein detecting the voltages on the third node and the fourth node comprises detecting the voltages on drains of a third transistor and a fourth transistor of the second current source.

17. The method of claim 12, wherein adjusting the resistance of the adjustable resistance circuit comprises:

comparing the charge pump current with a predetermined current so as to generate an output signal; and responding to the output signal, adjusting the resistance of the adjustable resistance circuit such that the charge pump current is substantially equal to the predetermined current.

* * * * *